United States Patent
Hintermaier

(10) Patent No.: US 6,669,857 B2
(45) Date of Patent: Dec. 30, 2003

(54) PROCESS FOR ETCHING BISMUTH-CONTAINING OXIDE FILMS

(75) Inventor: Frank Hintermaier, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/073,829

(22) Filed: Feb. 11, 2002

(65) Prior Publication Data

US 2002/0130105 A1 Sep. 19, 2002

Related U.S. Application Data

(63) Continuation of application No. PCT/DE00/02652, filed on Aug. 9, 2000.

(30) Foreign Application Priority Data

Aug. 9, 1999 (DE) .......................................... 199 37 503

(51) Int. Cl.$^7$ .......................... B44C 1/22; C03C 15/00; C03C 25/68; C23F 1/00; C25F 3/00
(52) U.S. Cl. .......................... 216/41; 216/109; 216/100
(58) Field of Search ................................. 216/100, 101, 216/108, 109, 41; 138/689, 691, 722, 745

(56) References Cited

U.S. PATENT DOCUMENTS 3,925,079 A  *  12/1975  Hager et al. ................. 430/295
4,759,823 A        7/1988  Asselanis et al.
5,510,651 A        4/1996  Maniar et al.
5,708,302 A  *    1/1998  Azuma et al. ............. 257/751
5,873,977 A        2/1999  Desu et al.

FOREIGN PATENT DOCUMENTS

EP        0 968 979 A1    1/2000
JP        58 010 852 A    1/1983

* cited by examiner

*Primary Examiner*—Parviz Hassanzadeh
*Assistant Examiner*—Roberts P Culbert
(74) *Attorney, Agent, or Firm*—Laurence A. Greenberg; Werner H. Stemer; Gregory L. Mayback

(57) ABSTRACT

A process is described for etching oxide films containing at least one bismuth-containing oxide, in particular a ferroelectric bismuth-containing mixed oxide. A substrate onto which at least one oxide film containing at least one bismuth-containing oxide has been applied is provided. An etching solution containing from 2 to 20% by weight of a fluoride ion donor, from 15 to 60% by weight of nitric acid and from 20 to 83% by weight of water is brought into contact with the substrate so that the etching solution can react with the oxide film. The etching solution is removed from the substrate. The etching solution is also used in a process for structuring bismuth-containing oxide films.

30 Claims, No Drawings

PROCESS FOR ETCHING BISMUTH-CONTAINING OXIDE FILMS

CROSS-REFERENCE TO RELATED APPLICATION

This application is a continuation of copending International Application No. PCT/DE00/02652, filed Aug. 9, 2000, which designated the United States.

BACKGROUND OF THE INVENTION

Field of the Invention

The present invention relates to a process for etching bismuth-containing oxide films. The present invention further relates to a process for structuring bismuth-containing oxide films.

Compared to conventional electronic memories, for example DRAMs and SRAMs, ferroelectric memories have the advantage that the stored information is not lost but remains stored even in the event of an interruption to the electric power supply. The persistence of ferroelectric memories is based on the fact that the polarization induced by an external electric field is essentially retained in ferroelectric materials even after the external electric field is switched off. Ferroelectric layers, e.g. of PZT (lead zirconate titanate), can be structured by, for example, wet chemical processes using HF, $HNO_3$ and $H_2O_2$. To be able to produce ferroelectric memories, in particular highly integrated ferroelectric memories, it has been proposed that bismuth-containing mixed oxides, for example strontium bismuth tantalate (SBT, $SrBi_2Ta_2O_9$), be used as the ferroelectric layer.

Unfortunately, it has been found that bismuth-containing mixed oxides can generally be structured only unsatisfactorily by an reactive ion etching (RIE) process as described in U.S. Pat. No. 5,873,977. The amount of material removed by etching is, even when reactive gases such as oxygen, chlorine, bromine, hydrogen chloride or hydrogen bromide are used, made up predominantly, or virtually exclusively of the material removed physically. Accordingly, the method of etching displays virtually no selectivity between materials and it is generally possible to achieve only poor dimensional accuracy during the structuring.

SUMMARY OF THE INVENTION

It is accordingly an object of the invention to provide a process for etching bismuth-containing oxide films, that overcomes the above-mentioned disadvantages of the prior art methods of this general type, by which both bismuth-containing oxide films which have not been heat treated and heat-treated bismuth-containing oxide films, especially oxide films containing strontium bismuth tantalate, can be etched.

With the foregoing and other objects in view there is provided, in accordance with the invention, an etching process. The process includes providing a substrate onto which at least one oxide film containing at least one bismuth-containing oxide has been applied. An etching solution containing from 2 to 20% by weight of a fluoride ion donor, from 15 to 60% by weight of nitric acid and from 20 to 83% by weight of water, is brought into contact with the substrate so that the etching solution can react with the oxide film. The etching solution is then removed from the substrate.

For the present purposes, the term "fluoride ion donor" encompasses all fluoride-containing compounds that dissociate at least partly into fluoride anions and countercations in aqueous solution. In preferred embodiments, the fluoride ion donor is ammonium fluoride $NH_4F$ and/or ammonium hydrogen fluoride $NH_4HF_2$.

For the present purposes, the term "bringing into contact" encompasses all methods customary in wet chemical etching, in particular dipping the substrate into the etching solution or spraying the substrate with the etching solution.

In an advantageous embodiment of the invention, the etching solution further contains mineral acids, in particular hydrochloric acid HCl or sulfuric acid $H_2SO_4$, and/or inorganic salts of mineral acids, in particular ammonium chloride $NH_4Cl$ or ammonium bromide $NH_4Br$, to regulate the pH. Acidification or buffering can be achieved by the additives, as a result of which the etching solution can be modified to match it to the properties of the film to be etched. Furthermore, the additives can influence the polarity of the etching solution and match it individually to the solubility of the end products of the etching process.

In addition, the etching solution may further contain organic surface-active substances, preferably alcohols, in particular ethanol or isopropanol, and/or acids, in particular acetic acid or propionic acid. The organic additives allow the surface tension of the etching solution to be modified and thus allow the wetting capability of the etching solution to be regulated.

In a further embodiment of the invention, the oxide film to be etched is a heat-treated oxide film. Without being tied to a particular explanation, it is presumed that the presence of fluoride ions in an acid medium is of great importance for the action of the etchant. It is presumed that the oxide ions in the bismuth-containing oxide layer are protonated by the acid and thus converted into hydroxide ions. These can easily be replaced by fluoride ions that have an ionic radius comparable to that of hydroxide ions. This leads to formation of acid-soluble fluoride complexes.

In an advantageous embodiment of the process of the invention, an oxide film containing a mixture of strontium oxide SrO, bismuth trioxide $Bi_2O_3$ and tantalum pentoxide $Ta_2O_5$ is etched. In a particularly advantageous embodiment of the process of the invention, the oxide film to be etched contains at least one oxide being strontium bismuth tantalate $SrBi_2TaO_9$, strontium bismuth tantalate derivatives in which tantalum is at least partly replaced by another transition metal or lanthanide, bismuth titanate $Bi_4Ti_3O_{12}$, and/or strontium bismuth titanates $SrBi_4Ti_4O_{15}$ and $Sr_2Bi_4Ti_5O_{18}$. In a further advantageous embodiment, the oxide film contains at least one niobium-doped oxide having the composition $SrBi_2Ta_{2-x}Nb_xO_9$ where $0 \leq x \leq 2$. The bismuth-containing oxide films to be etched according to the invention can be applied to the substrate by any methods customary in semiconductor technology, in particular by chemical vapor deposition, sol-gel or sputtering processes.

In a particular advantageous embodiment of the process of the invention, the substrate is treated with an aqueous hydrochloric acid solution after removal of the etching solution. By this treatment, residues which may remain on the substrate after contact with and removal of the etching solution can be removed simply and quickly from the substrate and the surface of the substrate can thus be prepared for a further treatment.

In a further particularly preferred embodiment of the process, the action of the etching solution on the oxide film is aided by mechanical rubbing. This can further reduce the contact time that is necessary to dissolve the oxide film and can thus accelerate the process. For the purposes of the present invention, the term mechanical rubbing refers, in particular, to the mechanical polishing or chemomechanical polishing methods known to those skilled in the art.

With the foregoing and other objects in view there is provided, in accordance with the invention, a structuring process. A substrate is provided and has an oxide film containing at least one bismuth-containing oxide disposed on a surface of the substrate. A mask is applied to the oxide film. An etching solution containing from 2 to 20% by weight of a fluoride ion donor, from 15 to 60% by weight of nitric acid and from 20 to 80% by weight of water, is brought into contact with the substrate so that the etching solution can react with regions of the oxide film not covered by the mask. The etching solution is removed from the substrate, and then the mask is removed.

The above-described processes of the invention are suitable both for heat-treated bismuth-containing oxide films and for bismuth-containing oxide films which have not been heat treated. Since heat-treated oxide films frequently have a greater chemical resistance to etching solutions, etching films which have not been heat treated makes it possible to use greatly diluted etching solutions which allow etching which is gentler on the substrate.

In a variant of the process for structuring oxide films, a strontium bismuth tantalate oxide film is applied to the substrate and is heat treated, and a photoresist is then applied to the oxide layer. Suitable photoresists and methods of applying them are known to those skilled in the art. According to customary methods, the photoresist is illuminated through a mask and subsequently developed and removed again from the unilluminated regions. An etching solution as described in the claims in an appropriate dilution is subsequently brought into contact with the substrate, so that the etching solution can act on the oxide film. After the appropriate etching time during which the oxide film is removed in those regions which are not protected by the photoresist, the etching solution is removed from the substrate. In general, the removal of the etching solution from the substrate in the process of the present invention is carried out using the methods known in semiconductor technology. In particular, it can be achieved by removal of the substrate from the etching solution or by rinsing the substrate with one or more washing solutions, e.g. water. It is also possible to employ a combination, so that the substrate is after-treated with one or more washing solutions after having been removed from the etching solution. In particular, the etched substrate can be rinsed with volatile, preferably water-miscible solvents such as acetone to accelerate drying. After removal of the etching solution from the substrate, the photoresist is removed.

In a further variant of the process for structuring oxide films, structuring is carried out prior to heat treatment of the oxide film. For this purpose, a structured photoresist layer is applied by customary methods, as described above, to the oxide layer deposited on the substrate and the oxide layer is subsequently removed in the uncovered regions by the etching solution described in the present patent application. In this variant of the process, it is generally possible to use more diluted etching solutions to bring about removal of the oxide layer. This is advantageous when the substrate is to be etched particularly gently, i.e. possible reaction of the substrate with the etching solution is to be avoided.

Other features which are considered as characteristic for the invention are set forth in the appended claims.

Although the invention is described herein as embodied in a process for etching bismuth-containing oxide films, it is nevertheless not intended to be limited to the details described, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments.

DESCRIPTION OF THE PREFERRED EMBODIMENTS

The process of the invention is best illuminated by the examples now given.

First, etching solutions suitable for the process of the invention can be obtained as now described.

An etching solution 1 is formed from 1.25 g of ammonium fluoride $NH_4F$ dissolved in 6.8 g of 65% strength nitric acid $HNO_3$.

An etching solution 1a is formed from one part by weight of the etching solution 1 diluted with one part by weight of deionized water $H_2O$.

An etching solution 1b is formed from one part by weight of the etching solution 1 diluted with two parts by weight of deionized water $H_2O$.

An etching solution 2 is formed from 1.9 g of ammonium hydrogen fluoride $NH_4HF_2$ dissolved in 7.0 g of 65% strength nitric acid.

An etching solution 2a is formed from one part by weight of the etching solution 2 diluted with one part by weight of dionized water $H_2O$.

An etching solution 2b is formed from one part by weight of etching solution 2 diluted with two parts by weight of deionized water $H_2O$.

Table 1 below lists the compositions and the parts by weight of the components relative to one another.

TABLE 1

COMPOSITIONS OF THE ETCHING SOLUTIONS 1, 1a, 1b, 2, 2a and 2b.

|  | Solution 1 | Solution 1a | Solution 1b | Solution 2 | Solution 2a | Solution 2b |
|---|---|---|---|---|---|---|
| $HNO_3$ (g) | 4.42 | 4.42 | 4.42 | 4.55 | 4.55 | 4.55 |
| $HNO_3$ % by weight | 54.9 | 27.5 | 18.3 | 51.1 | 25.6 | 17.0 |
| $NH_4F$ (g) | 1.25 | 1.25 | 1.25 | — | — | — |
| $NH_4F$ % by weight | 15.5 | 7.8 | 5.2 | — | — | — |
| $NH_4HF_2$ (g) | — | — | — | 1.9 | 1.9 | 1.9 |
| $NH_4HF_2$ % by weight | — | — | — | 21.4 | 10.7 | 7.1 |
| $H_2O$ (g) | 2.38 | 10.43 | 18.48 | 2.45 | 11.35 | 20.25 |
| $H_2O$ % by weight | 29.6 | 64.8 | 76.5 | 27.5 | 63.8 | 75.8 |

Second, suitable etching processes are now described.

An $SrO/Bi_2O_3/Ta_2O_5$ film having a thickness of 120 nm is deposited on a Pt electrode at a temperature of about 430° C. by a chemical vapor deposition (CVD) process. The film has a composition in which Sr, Bi and Ta are present in an Sr:Bi:Ta ratio of 18:45:37. The Pt electrode coated with the $SrO/Bi_2O_3/Ta_2O_5$ film is subsequently heated at a temperature of about 800° C. in an $O_2$ atmosphere for one hour.

10 drops of one of the above-described etching solutions 1, 1a, 1b, 2, 2a and 2b are subsequently applied in each case to a 4 cm² (2×2 cm) test specimen to remove the ceramic layer again. After a certain etching time, the silvery color of the Pt electrode reappears. The etching times for the different test specimens are listed in Table 2. The test specimen is subsequently rinsed with deionized water and dried. To accelerate drying, the test specimen can be additionally rinsed with acetone after rinsing with the deionized water.

When using the undiluted etching mixtures 1 and 2, the formation of a residue is occasionally observed. The residue formation is dependant on the film composition and the pretreatment of the film, for example the heat treatment conditions. However, the residues can be removed again by use of aqueous hydrochloric acid. The residues dissolve within a few seconds in concentrated hydrochloric acid. Surface analysis by XRF shows that no residues of the film remain on the etched surfaces.

The etching time can additionally be reduced by mechanical rubbing. In the laboratory test, this is achieved by rubbing with a little stick covered with an absorbent cotton. Apart from accelerating the etching process, this also avoids residue formation.

TABLE 2

ETCHING TIMES WHEN USING THE VARIOUS SOLUTIONS

| Solution | Etching time (sec.) | Remark |
|---|---|---|
| 1 | 10 | Residue |
| 1a | 30 | |
| 1b | 90 | |
| 2 | 5 | Residue |
| 2a | 20 | |
| 2b | 60 | |

Modification of the etching solutions are now described.

As additional components, the etching solutions used in the process of the invention can further contain additives to regulate the pH and surface-active additives.

Additions of further inorganic components such as $NH_4Cl$, $NH_4Br$ or inorganic mineral acids such as HCl or $H_2SO_4$ enables the etching solutions to be buffered or acidified. Furthermore, the polarity of the etching solution can be influenced by these additives and the solubility of the end products of the etching process can thus be improved further.

Additions of organic compounds enables the surface tension of the etching solution to be modified and the wetting capability of the etching solution thus to be regulated. Particularly useful classes of compounds are alcohols, in particular ethanol or isopropanol, and acids, in particular acetic acid or propionic acid.

Examples of suitable oxide layers are now discussed.

In general, the invention makes it possible to etch and/or structure oxide films that contain at least one bismuth-containing oxide, in particular a ferroelectric bismuth-containing mixed oxide.

For example, the processes of the invention can be used to etch or structure layers containing a mixture of strontium oxide SrO, bismuth trioxide $Bi_2O_3$ and tantalum pentoxide $Ta_2O_5$. Furthermore, the processes of the invention are suitable for etching or structuring layers containing strontium bismuth tantalate $SrBi_2Ta_2O_9$ or strontium bismuth tantalate derivatives in which tantalum is at least partly replaced by another transition metal or lanthanide. Examples of such derivatives are niobium-doped oxides of the composition $SrBi_2Ta_{2-x}Nb_xO_9$ where $0 \leq x \leq 2$. Further suitable materials for the layers are bismuth titanate $Bi_4Ti_3O_{12}$ and the strontium bismuth titanates $SrBi_4Ti_4O_{15}$ and $Sr_2Bi_4Ti_5O_{18}$.

I claim:

1. An etching process, which comprises the steps of:
   providing a substrate onto which at least one oxide film containing at least one bismuth-containing oxide has been applied;
   bringing an etching solution containing from 2 to 20% by weight of a fluoride ion donor, from 15 to 60% by weight of nitric acid and from 20 to 83% by weight of water, into contact with the substrate for reacting the etching solution with the oxide film;
   selecting the fluoride ion donor from the group consisting of ammonium fluoride $NH_4F$ and ammonium hydrogen fluoride $NH_4HF_2$; and
   removing the etching solution from the substrate.

2. The process according to claim 1, which comprises adding at least one substance selected from the group consisting of mineral acids, hydrochloric acid HCl, sulfuric acid $H_2SO_4$, inorganic salts of mineral acids, ammonium chloride $NH_4Cl$, and ammonium bromide $NH_4Br$, to the etching solution to regulate the pH.

3. The process according to claim 1, which comprises adding at least one substance selected from the group consisting of organic surface-active substances, alcohols, ethanol, isopropanol, acids, acetic acid and propionic acid, to the etching solution.

4. The process according to claim 1, which comprises forming the oxide film as a heat-treated oxide film.

5. The process according to claim 1, which comprises forming the oxide film to contain a mixture of strontium oxide SrO, bismuth trioxide $Bi_2O_3$ and tantalum pentoxide $Ta_2O_5$.

6. The process according to claim 1, which comprises forming the oxide film to contain at least one oxide selected from the group consisting of strontium bismuth tantalate $SrBi_2Ta_2O_9$, strontium bismuth tantalate derivatives in which tantalum has been at least partly replaced by another transition metal or lanthanide, bismuth titanate $Bi_4Ti_3O_{12}$, strontium bismuth titanate $SrBi_4Ti_4O_{15}$, and strontium bismuth titanate $Sr_2Bi_4Ti_5O_{18}$.

7. The process according to claim 6, which comprises forming the oxide film to contain at least one niobium-doped oxide having a composition of $SrBi_2Ta_{2-x}Nb_xO_9$ where $0 \leq x \leq 2$.

8. The process according to claim 1, which comprises treating the substrate with an aqueous hydrochloric acid solution after removal of the etching solution.

9. The process according to claim 1, which comprises using a ferroelectric bismuth-containing mixed oxide as the bismuth-containing oxide.

10. The process according to claim 9, which comprises aiding an action of the etching solution on the bismuth-containing mixed oxide by mechanical rubbing.

11. A structuring process, which comprises the steps of:
    providing a substrate with an oxide film containing at least one bismuth-containing oxide disposed on a surface of the substrate;
    applying a mask to the oxide film;
    bringing an etching solution containing from 2 to 20% by weight of a fluoride ion donor, from 15 to 60% by weight of nitric acid and from 20 to 80% by weight of water into contact with the substrate for reacting the etching solution with regions of the oxide film not covered by the mask;

selecting the fluoride ion donor from the group consisting of ammonium fluoride $NH_4F$ and ammonium hydrogen fluoride $NH_4HF_2$;

removing the etching solution from the substrate; and removing the mask.

12. The process according to claim 11, which comprises adding at least one substance selected from the group consisting of mineral acids, hydrochloric acid HCl, sulfuric acid $H_2SO_4$, inorganic salts of mineral acids, ammonium chloride $NH_4Cl$, and ammonium bromide $NH_4Br$, to the etching solution to regulate the pH.

13. The process according to claim 11, which comprises adding at least one substance selected from the group consisting of organic surface active substances, alcohols, ethanol, isopropanol, acids, acetic acid, and propionic acid, to the etching solution.

14. The process according to claim 11, which comprises forming the oxide film as a heat-treated oxide film.

15. The process according to claim 11, which comprises forming the oxide film to contain a mixture of strontium oxide SrO, bismuth trioxide $Bi_2O_3$, and tantalum pentoxide $Ta_2O_5$.

16. The process according to claim 11, which comprises forming the oxide film to contain at least one oxide selected from the group consisting of strontium bismuth tantalate $SrBi_2Ta_2O_9$, strontium bismuth tantalate derivatives in which tantalum has been at least partly replaced by another transition metal or lanthanide, bismuth titanate $Bi_4Ti_3O_{12}$, and strontium bismuth titanate $SrBi_4Ti_4O_{15}$, and strontium bismuth titanate $Sr_2Bi_4O_{18}$.

17. The process according to claim 16, which comprises forming the oxide film to contain at least one niobium-doped oxide of a composition $SrBi_2Ta_{2-x}Nb_xO_9$ where $0 \leq x \leq 2$.

18. The process according to claim 11, which comprises treating the substrate with an aqueous hydrochloric acid solution after removal of the etching solution.

19. The process according to claim 11, which comprises using a ferroelectric bismuth-containing mixed oxide as the bismuth-containing oxide.

20. The process according to claim 19, which comprises aiding an action of the etching solution on the bismuth-containing mixed oxide by mechanical rubbing.

21. An etching process, which comprises the steps of:
providing a substrate onto which at least one oxide film containing at least one bismuth-containing oxide has been applied;
bringing an etching solution containing from 2 to 20% by weight of a fluoride ion donor, from 15 to 60% by weight of nitric acid and from 20 to 83% by weight of water, into contact with the substrate for reacting the etching solution with the oxide film;
adding at least one substance selected from the group consisting of mineral acids, hydrochloric acid HCl, sulfuric acid $H_2SO_4$, inorganic salts of mineral acids, ammonium chloride $NH_4Cl$, and ammonium bromide $NH_4Br$, to the etching solution to regulate the pH; and
removing the etching solution from the substrate.

22. An etching process, which comprises the steps of:
providing a substrate onto which at least one oxide film containing at least one bismuth-containing oxide has been applied;
bringing an etching solution containing from 2 to 20% by weight of a fluoride ion donor, from 15 to 60% by weight of nitric acid and from 20 to 83% by weight of water, into contact with the substrate for reacting the etching solution with the oxide film;
adding at least one substance selected from the group consisting of organic surface-active substances, alcohols, ethanol, isopropanol, acids, acetic acid, and propionic acid, to the etching solution; and
removing the etching solution from the substrate.

23. An etching process, which comprises the steps of:
providing a substrate onto which at least one oxide film containing at least one bismuth-containing oxide has been applied;
forming the oxide film to contain at least one niobium-doped oxide having a composition of $SrBi_2Ta_{2-x}Nb_xO_9$ where $0 \leq x \leq 2$;
bringing an etching solution containing from 2 to 20% by weight of a fluoride ion donor, from 15 to 60% by weight of nitric acid and from 20 to 83% by weight of water, into contact with the substrate for reacting the etching solution with the oxide film; and
removing the etching solution from the substrate.

24. An etching process, which comprises the steps of:
providing a substrate onto which at least one oxide film containing at least one bismuth-containing oxide has been applied;
bringing an etching solution containing from 2 to 20% by weight of a fluoride ion donor, from 15 to 60% by weight of nitric acid and from 20 to 83% by weight of water, into contact with the substrate for reacting the etching solution with the oxide film;
removing the etching solution from the substrate; and
treating the substrate with an aqueous hydrochloric acid solution after removal of the etching solution.

25. An etching process, which comprises the steps of:
providing a substrate onto which at least one oxide film containing a ferroelectric bismuth-containing mixed oxide;
bringing an etching solution containing from 2 to 20% by weight of a fluoride ion donor, from 15 to 60% by weight of nitric acid and from 20 to 83% by weight of water, into contact with the substrate for reacting the etching solution with the oxide film;
aiding an action of the etching solution on the bismuth-containing mixed oxide by mechanical rubbing; and
removing the etching solution from the substrate.

26. A structuring process, which comprises the steps of:
providing a substrate with an oxide film containing at least one bismuth-containing oxide disposed on a surface of the substrate;
applying a mask to the oxide film;
bringing an etching solution containing from 2 to 20% by weight of a fluoride ion donor, from 15 to 60% by weight of nitric acid and from 20 to 80% by weight of water into contact with the substrate for reacting the etching solution with regions of the oxide film not covered by the mask;
adding at least one substance selected from the group consisting of mineral acids, hydrochloric acid HCl, sulfuric acid $H_2SO_4$, inorganic salts of mineral acids, ammonium chloride $NH_4Cl$, and ammonium bromide $NH_4Br$, to the etching solution to regulate the pH;
removing the etching solution from the substrate; and
removing the mask.

27. A structuring process, which comprises the steps of:
- providing a substrate with an oxide film containing at least one bismuth-containing oxide disposed on a surface of the substrate;
- applying a mask to the oxide film;
- bringing an etching solution containing from 2 to 20% by weight of a fluoride ion donor, from 15 to 60% by weight of nitric acid and from 20 to 80% by weight of water into contact with the substrate for reacting the etching solution with regions of the oxide film not covered by the mask;
- adding at least one substance selected from the group consisting of organic surface-active substances, alcohols, ethanol, isopropanol, acids, acetic acid, and propionic acid, to the etching solution;
- removing the etching solution from the substrate; and
- removing the mask.

28. A structuring process, which comprises the steps of:
- providing a substrate with an oxide film containing at least one bismuth-containing oxide disposed on a surface of the substrate;
- applying a mask to the oxide film;
- bringing an etching solution containing from 2 to 20% by weight of a fluoride ion donor, from 15 to 60% by weight of nitric acid and from 20 to 80% by weight of water into contact with the substrate for reacting the etching solution with regions of the oxide film not covered by the mask;
- forming the oxide film to contain at least one niobium-doped oxide of a composition $SrBi_2Ta_{2-x}Nb_xO_9$ where $0 \leq x \leq 2$;
- removing the etching solution from the substrate; and
- removing the mask.

29. A structuring process, which comprises the steps of:
- providing a substrate with an oxide film containing at least one bismuth-containing oxide disposed on a surface of the substrate;
- applying a mask to the oxide film;
- bringing an etching solution containing from 2 to 20% by weight of a fluoride ion donor, from 15 to 60% by weight of nitric acid and from 20 to 80% by weight of water into contact with the substrate for reacting the etching solution with regions of the oxide film not covered by the mask;
- removing the etching solution from the substrate;
- removing the mask; and
- treating the substrate with an aqueous hydrochloric acid solution after removal of the etching solution.

30. A structuring process, which comprises the steps of:
- providing a substrate with an oxide film containing a ferroelectric bismuth-containing mixed oxide disposed on a surface of the substrate;
- applying a mask to the oxide film;
- bringing an etching solution containing from 2 to 20% by weight of a fluoride ion donor, from 15 to 60% by weight of nitric acid and from 20 to 80% by weight of water into contact with the substrate for reacting the etching solution with regions of the oxide film not covered by the mask;
- aiding an action of the etching solution on the bismuth-containing mixed oxide by mechanical rubbing;
- removing the etching solution from the substrate; and
- removing the mask.

* * * * *

UNITED STATES PATENT AND TRADEMARK OFFICE
CERTIFICATE OF CORRECTION

PATENT NO. : 6,669,857 B2
DATED : December 30, 2003
INVENTOR(S) : Frank Hintermaier It is certified that error appears in the above-identified patent and that said Letters Patent is hereby corrected as shown below:

<u>Column 7,</u>
Line 33, should read as follows: -- bismuth titanate $Sr_2Bi_4Ti_5O_{18}$. --

Signed and Sealed this

Sixth Day of April, 2004

JON W. DUDAS
*Acting Director of the United States Patent and Trademark Office*